(12) United States Patent
Furukawa

(10) Patent No.: US 10,833,237 B2
(45) Date of Patent: Nov. 10, 2020

(54) THERMOELECTRIC MODULE

(71) Applicant: KYOCERA Corporation, Kyoto (JP)

(72) Inventor: Tomohiro Furukawa, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/463,841

(22) PCT Filed: Oct. 26, 2017

(86) PCT No.: PCT/JP2017/038733
§ 371 (c)(1),
(2) Date: May 23, 2019

(87) PCT Pub. No.: WO2018/100933
PCT Pub. Date: Jun. 7, 2018

(65) Prior Publication Data
US 2019/0334074 A1    Oct. 31, 2019

(30) Foreign Application Priority Data

Nov. 29, 2016  (JP) ................................. 2016-231465

(51) Int. Cl.
*H01L 35/32*  (2006.01)
*H01L 35/02*  (2006.01)
*H01L 35/30*  (2006.01)

(52) U.S. Cl.
CPC .............. *H01L 35/32* (2013.01); *H01L 35/02* (2013.01); *H01L 35/30* (2013.01)

(58) Field of Classification Search
CPC ......... H01L 35/02; H01L 35/30; H01L 35/32; H01L 35/10; H01L 35/04
See application file for complete search history.

(56) References Cited

U.S. PATENT DOCUMENTS

| 2007/0125411 A1* | 6/2007 | Yasutake | ................. | H01L 35/08 |
|---|---|---|---|---|
| | | | | 136/200 |
| 2016/0027984 A1* | 1/2016 | Shiraishi | ................. | H01L 35/34 |
| | | | | 136/230 |

FOREIGN PATENT DOCUMENTS

JP    2009-129968 A    6/2009

* cited by examiner

*Primary Examiner* — Bethany L Martin
(74) *Attorney, Agent, or Firm* — Volpe Koenig

(57) ABSTRACT

A thermoelectric module according to the present disclosure includes: a pair of insulating substrates, each insulating substrate including a one main surface in a plan view, and a rectangular facing region of the one main surface, the rectangular facing regions facing each other; wiring conductors located on the one main surfaces of the pair of insulating substrates, respectively; a pair of metal plates located on other main surfaces opposite to the one main surfaces of the pair of insulating substrates, respectively; and a plurality of thermoelectric elements located between the one main surfaces of the pair of insulating substrates. At least one insulating substrate and at least one metal plate include a protrusion protruding from a one side of the rectangular facing region in the plan view, and a metal pattern located on the one main surface of the protrusion, the metal pattern not electrically connected to the wiring conductor.

14 Claims, 6 Drawing Sheets

THERMOELECTRIC MODULE

CROSS-REFERENCE TO RELATED APPLICATIONS

This application is a national stage entry according to 35 U.S.C. 371 of International Application No. PCT/JP2017/038733 filed on Oct. 26, 2017, which claims priority to Japanese Patent Application No. 2016-231465 filed on Nov. 29, 2016, the contents of which are entirely incorporated herein by reference.

TECHNICAL FIELD

The present disclosure relates particularly to a thermoelectric module used for, in particular, temperature control of a seat cooler for an automobile, temperature control of a fuel cell, and the like.

BACKGROUND

In a thermoelectric module, for example, when electric power is supplied to a thermoelectric element, a temperature difference can be generated between a pair of support substrates, that is, between one support substrate and the other support substrate. In the thermoelectric module, for example, when a temperature difference is generated between one support substrate and the other support substrate, electric power can be generated by the thermoelectric element. By utilizing these characteristics, the thermoelectric module is used for temperature control or thermoelectric power generation.

Examples of such a thermoelectric module include a thermoelectric module disclosed in Japanese Unexamined Patent Publication JP-A 2009-129968 (Patent Literature 1), for example. The thermoelectric module disclosed in JP-A 2009-129968 (Patent Literature 1) includes a pair of insulating substrates, a metal plate attached to each of main surfaces outside the pair of insulating substrates, a plurality of thermoelectric elements located inside the pair of insulating substrates, electrodes (wiring conductors) provided on main surfaces inside the pair of insulating substrates to connect the plurality of thermoelectric elements, and a lead member for power feeding.

SUMMARY

A thermoelectric module according to the disclosure includes a pair of insulating substrates, each insulating substrate of the pair of insulating substrates including a one main surface in a plan view, and a rectangular facing region of the one main surface, the rectangular facing regions of the pair of insulating substrates facing each other, wiring conductors located on the one main surfaces of the pair of insulating substrates, respectively, a pair of metal plates located on other main surfaces opposite to the one main surfaces of the pair of insulating substrates, respectively, and a plurality of thermoelectric elements located between the one main surfaces of the pair of insulating substrates. Further, at least one insulating substrate of the pair of insulating substrates and at least one metal plate of the pair of metal plates include a protrusion protruding from a one side of the rectangular facing region in the plan view, and a metal pattern located on the one main surface of the protrusion, the metal pattern not electrically connected to any one of the wiring conductors.

DETAILED DESCRIPTION

In the thermoelectric module of the related art, during assembling of a thermoelectric module and during use of the thermoelectric module, there is a concern that warpage or deformation may occur due to a difference in thermal expansion between an insulating substrate and a metal plate, which may reduce the durability. In addition, when being used, a heat sink is attached to an outer side of the metal plate, and there is also a concern that a gap may be generated between the metal plate and the heat sink, and heat dissipation property may deteriorate.

The thermoelectric module according to the disclosure may improve durability and suppress deterioration in heat dissipation property.

Hereinafter, embodiments of the thermoelectric module will be described in detail with reference to the drawings.

Figure 1:
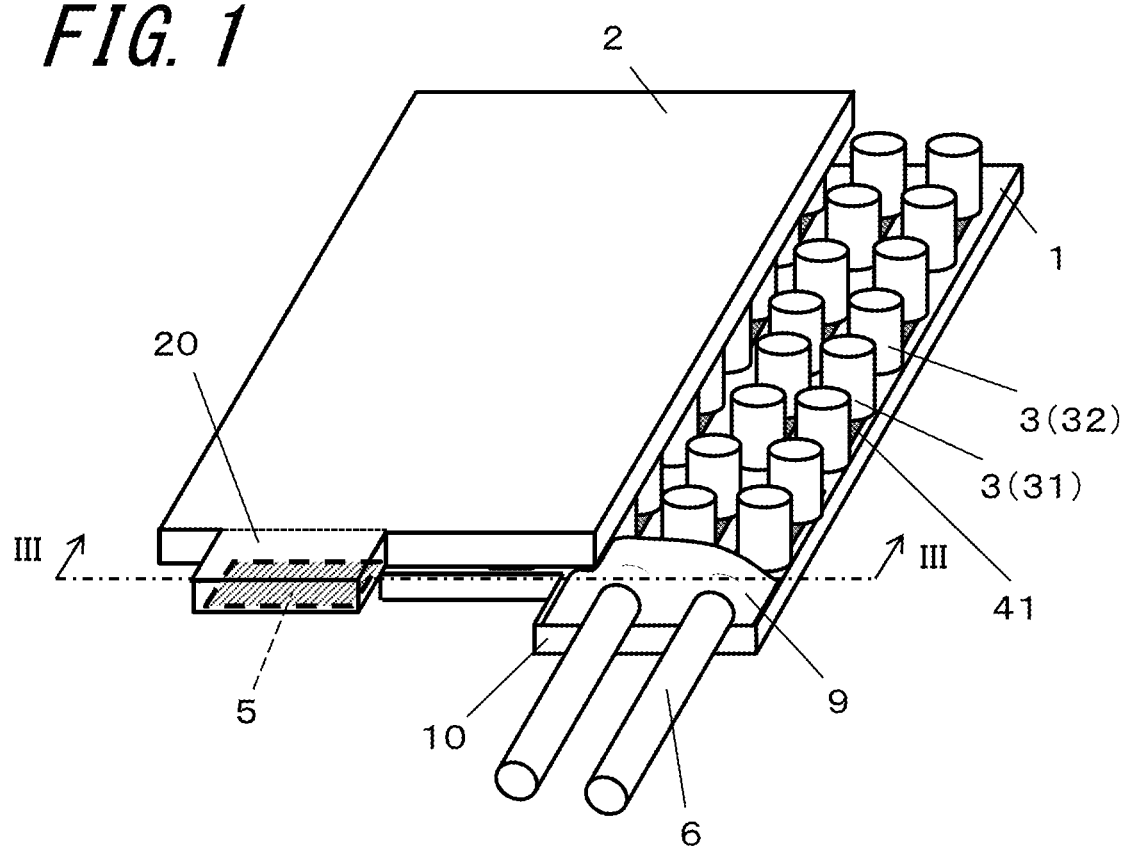
FIG. 1 is an exploded perspective view showing a thermoelectric module according to an example of an embodiment.
Figure 2:
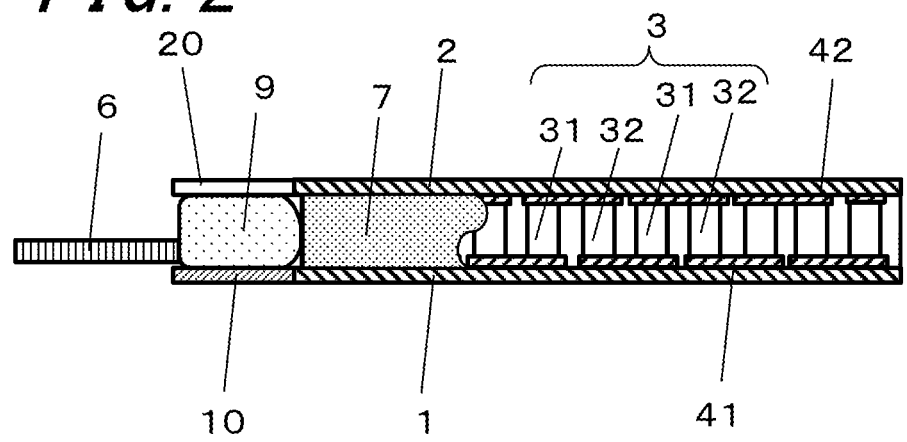
FIG. 2 is a side view showing the thermoelectric module shown in FIG. 1.

FIG. 1 is an exploded perspective view showing a thermoelectric module according to an example of the embodiment, and FIG. 2 is a side view showing the thermoelectric module shown in FIG. 1. In addition, FIG. 3 is an enlarged cross-sectional view showing a principal part taken along the line III-III shown in FIG. 1.

Figure 3:
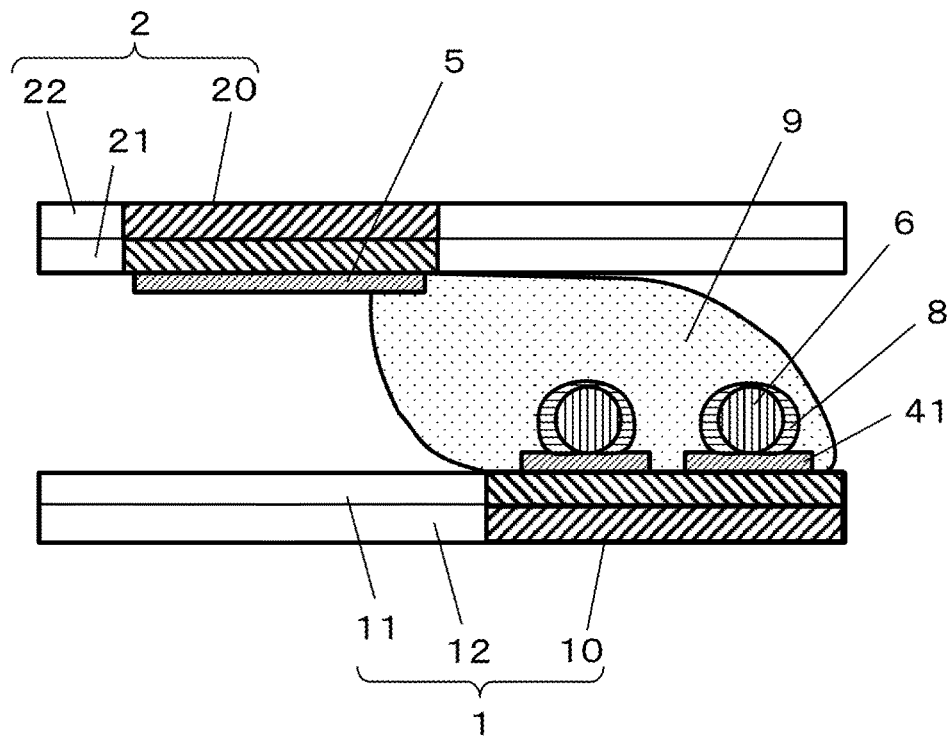
FIG. 3 is an enlarged cross-sectional view showing a principal part taken along the line III-III shown in FIG. 1.

The thermoelectric module shown in FIGS. 1 to 3 includes a pair of insulating substrates 11 and 21, each insulating substrate of the pair of insulating substrates 11 and 21 including a one main surface in a plan view, and a rectangular facing region of the one main surface, the rectangular facing region of the pair of insulating substrates 11 and 21 facing each other, wiring conductors 41 and 42 located on the one main surfaces of the pair of insulating substrates 11 and 21, respectively, a pair of metal plates 12 and 22 located on other main surfaces opposite to the one main surfaces of the pair of insulating substrates 11 and 21, respectively, and a plurality of thermoelectric elements 3 located between the one main surfaces of the pair of insulating substrates 11 and 21. Then, at least one insulating substrate 21 of the pair of insulating substrates 11 and 21 and at least one metal plate 22 of the pair of metal plates 12 and 22 include a protrusion 20 protruding from a one side of the facing region in the plan view, and a metal pattern 5 located on the one main surface of the protrusion 20, the metal pattern 5 not electrically connected to the wiring conductor 42. Here, the combination of the insulating substrate 11 and the metal plate 12 is a first support substrate 1, and the combination of the insulating substrate 21 and the metal plate 22 is a second support substrate 2.

It should be noted that, in FIG. 1, the thermoelectric module is shown in a partially disassembled state for convenience of explanation. Specifically, the second support substrate 2 and the wiring conductor 42 are detached and shifted away from the thermoelectric element 3, and a sealing material 7 shown in FIG. 2 is also omitted.

In the thermoelectric module according to the present disclosure, a plurality of thermoelectric elements 3 are supported so as to be interposed between a pair of support substrates including the first support substrate 1 and the second support substrate 2. The first support substrate 1 is disposed such that an upper surface thereof is the one main surface facing the second support substrate 2, and the second support substrate 2 is disposed such that a lower surface thereof is the one main surface facing the first support substrate 1.

As described above, the first support substrate 1 includes the first insulating substrate 11 and the first metal plate 12. The first wiring conductor 41 is located on the one main surface (upper surface) of the first support substrate 1, so that the one main surface (upper surface) side of the first support substrate 1 is the first insulating substrate 11, and the other main surface (lower surface) side thereof is the first metal plate 12.

Likewise the first support substrate 1, the second support substrate 2 also includes the second insulating substrate 21 and the second metal plate 22. The second wiring conductor 42 is located on the one main surface (lower surface) of the second support substrate 2, so that the one main surface (lower surface) side of the second support substrate 2 is the second insulating substrate 21, the other main surface (upper surface) side is the second metal plate 22.

Examples of a material for forming the first insulating substrate 11 constituting the first supporting substrate 1 and the second insulating substrate 21 constituting the second supporting substrate 2 include epoxy resin, polyimide resin, alumina filler-added epoxy resin, alumina ceramics, and aluminum nitride ceramics. In addition, examples of a material for forming the first metal plate 12 constituting the first support substrate 1 and the second metal plate 22 constituting the second support substrate 2 include copper, silver, and silver-palladium.

The first insulating substrate 11 constituting the first support substrate 1 and the second insulating substrate 21 constituting the second support substrate 2 include rectangular facing regions which face each other except for the protrusion 10 and the protrusion 20 described below. The dimensions of the rectangular regions facing each other in a plan view may be set to 40 to 50 mm in length, 20 to 30 mm in width, and 0.25 to 0.35 mm in thickness, for example.

The first wiring conductor 41 and the second wiring conductor 42 are located on the facing regions which face each other on the one main surface of the first insulating substrate 11 and the second insulating substrate 21, respectively. The first wiring conductor 41 and the second wiring conductor 42 electrically connect the plurality of thermoelectric elements 3 and the lead members 6. For example, the first wiring conductor 41 and the second wiring conductor 42 may be obtained by attaching copper plates to the one main surfaces of the first insulating substrate 11 and the second insulating substrate 21 which face each other, masking portions to be the first wiring conductor 41 and the second wiring conductor 42, and etching away regions other than the masked region. In addition, the first wiring conductor 41 and the second wiring conductor 42 may be obtained by bonding copper plates that are formed by punching into the shape of the first wiring conductor 41 and the second wiring conductor 42, to the first insulating substrate 11 and the second insulating substrate 21. The material for forming the first wiring conductor 41 and the second wiring conductor 42 is not limited to the copper, and may be a material such as silver or silver-palladium, for example.

A plurality of thermoelectric elements 3 are located between the one main surfaces of the first insulating substrate 11 and the second insulating substrate 21. The thermoelectric element 3 is a member for controlling temperature by using the Peltier effect or for generating power by using the Seebeck effect. The plurality of thermoelectric elements 3 are located in rows and columns at intervals of 0.5 to 2 times the diameter of the thermoelectric element 3, for example, and are joined to the first wiring conductor 41 and the second wiring conductor 42 with solder. Specifically, the p-type thermoelectric elements 31 and the n-type thermoelectric elements 32 are alternately located adjacent to each other and are electrically connected in series through the first wiring conductor 41, the second wiring conductor 42, and a solder, and thus all the thermoelectric elements 3 are connected in series.

The thermoelectric elements 3 are classified into p-type thermoelectric elements 31 and n-type thermoelectric elements 32. A main body portion of the thermoelectric element 3 is formed of a thermoelectric material formed of an $A_2B_3$ type crystal (A is Bi and/or Sb, B is Te and/or Se), and preferably, a Bi (bismuth) and a Te (tellurium) based thermoelectric material. Specifically, the p-type thermoelectric element 31 is formed of a thermoelectric material formed of a solid solution of $Bi_2Te_3$ (bismuth telluride) and $Sb_2Te_3$ (antimony telluride), for example. In addition, the n-type thermoelectric element 32 is formed of a thermoelectric material formed of a solid solution of $Bi_2Te_3$ (bismuth telluride) and $Bi_2Se_3$ (bismuth selenide), for example.

Here, the main body portion to be the p-type thermoelectric element 31 is a rod-shaped material obtained by solidifying the p-type thermoelectric material formed of bismuth, antimony, and tellurium which has been once melted and then solidified, in one direction by the Bridgman method. The main body portion to be the n-type thermoelectric element 32 is a rod-shaped material obtained by solidifying the n-type thermoelectric material formed of bismuth, tellurium and selenium which has been once melted and then solidified, in one direction by the Bridgman method.

The side surfaces of these rod-shaped main body portions are coated with a resist that prevents adhesion of plating, and then cut to a length of, for example, 0.3 to 5 mm using a wire saw. Next, a nickel layer and a tin layer are sequentially formed on the cut surface using electroplating. Finally, by removing the resist with a solution, the p-type thermoelectric element 31 and the n-type thermoelectric element 32 may be obtained.

The shape of the thermoelectric element 3 may be, for example, a cylindrical shape, a quadrangular prism, a polygonal prism, or the like. In particular, making the shape of the thermoelectric element 3 into a cylindrical shape is preferable in that the influence of thermal stress generated in the thermoelectric element 3 under the heat cycle can be reduced. When the thermoelectric element 3 has a cylindrical shape, dimensions thereof are set to 1 to 3 mm in diameter and 0.3 to 5 mm in height, for example.

The plurality of thermoelectric elements 3 held between the first support substrate 1 and the second support substrate 2 may be provided with the sealing material 7 formed of a resin such as a silicone resin or an epoxy resin therearound, as necessary. Although the deformation is large on the outer peripheral side due to the temperature difference between the first support substrate 1 and the second support substrate 2, when the sealing material 7 is located around the plurality of thermoelectric elements 3 to, for example, fill the gaps between the plurality of thermoelectric elements 3 located on the outer peripheral side, the sealing material 7 may serve as the reinforcing material, thus suppressing peeling between the thermoelectric element 3 and the first support substrate 1 and the second support substrate 2.

The lead member 6 for power feeding is joined to the first wiring conductor 41 located on the one main surface of the first support substrate 1 by a joining material 8 such as solder, or by a laser welding, for example. The lead member 6 is a member for supplying electric power to the thermoelectric element 3 or outputting electric power generated by the thermoelectric element 3. In this example, in a plan view, the first support substrate 1 includes the protrusion 10 protruding from one side of the facing region, and the first wiring conductor 41 extends to the protrusion 10, and the lead member 6 is joined to the first wiring conductor 41 on one main surface of the protrusion 10.

At a joint portion of the lead member 6, a covering material 9 formed of a resin such as an epoxy resin or a silicone resin is provided as necessary, for protection and reinforcement of the joint portion.

The second support substrate 2 is provided with the protrusion 20 protruding from one side of the facing region in a plan view. The protrusion 20 is located at a position not overlapping with the joint portion of the lead member 6, when viewed in a direction perpendicular to the one main surface of the second support substrate 2.

Here, protruding amounts (protruding distance) of the protrusion 10 and the protrusion 20 are each set to 1 to 5 mm, for example, and widths thereof along the sides of the first support substrate 1 and the second support substrate 2 are each set to 5 to 30 mm, for example.

When the covering material 9 is provided, the joining strength of the covering material 9 may be improved by joining the covering material 9 to the protrusion 10 and the protrusion 20.

However, when the protrusion 20 is simply provided, there is a concern that the durability and the heat dissipation property are reduced. Therefore, the thermoelectric module of the present embodiment includes the metal pattern 5 located on one main surface of the protrusion 20, the metal pattern 5 being not electrically connected to the wiring conductor 42. As a result, the second insulating substrate 21 is interposed between the second metal plate 22 and the metal pattern 5, and the rigidity of the protrusion 20 is improved. In addition, warpage and deformation due to a difference in thermal expansion between the second insulating substrate 21 and the second metal plate 22 may be suppressed. Therefore, the durability of the thermoelectric module may be improved, and the deterioration in heat dissipation property may also be suppressed.

The metal pattern 5 located on the protrusion 20 is shaped to match the shape of the protrusion 20, for example, and is patterned to have an outer peripheral shape along each side of the protrusion 20 with a slight gap from the side of the protrusion 20. It is effective that the metal pattern 5 occupies an area of 70 to 95% of the area of one main surface of the protrusion 20.

In addition, the metal pattern 5 may be formed of the same material as a plate material of the second metal plate 22. Thereby, the warpage and deformation due to the thermal stress may be further suppressed.

Figure 4:
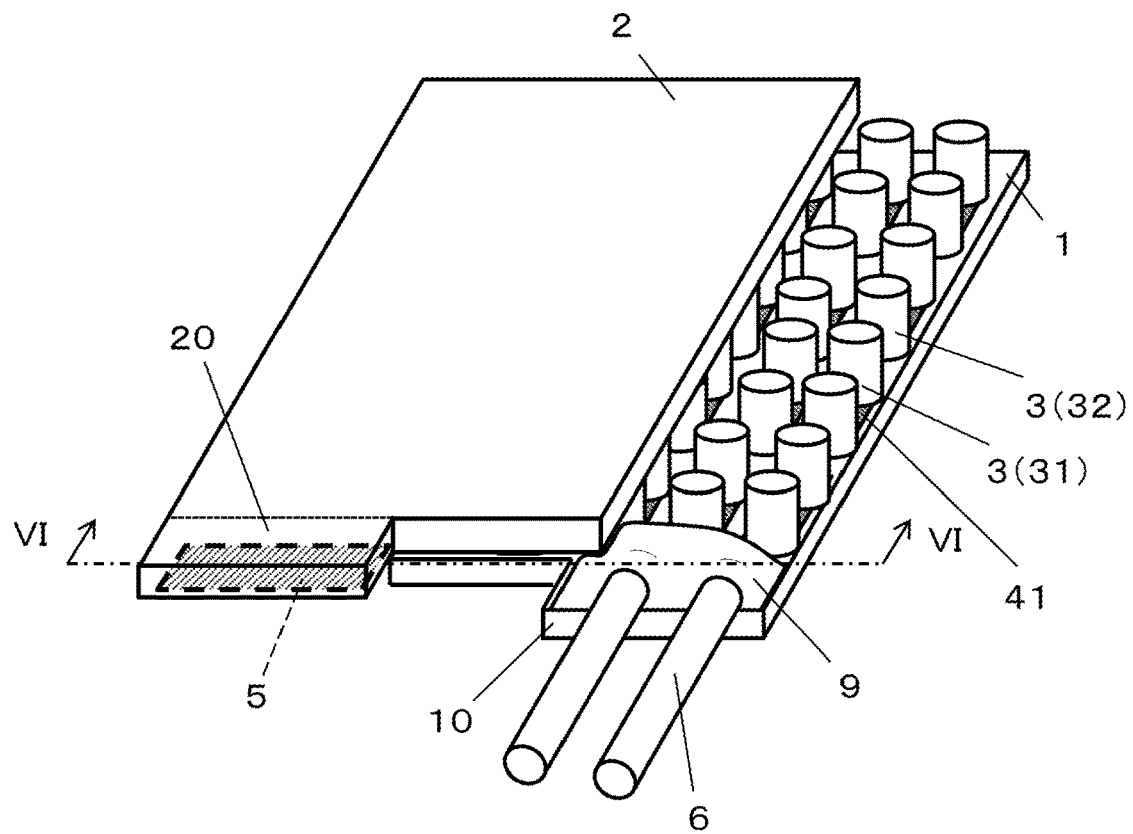
FIG. 4 is an exploded perspective view showing a thermoelectric module according to another example of the embodiment.
Figure 5:
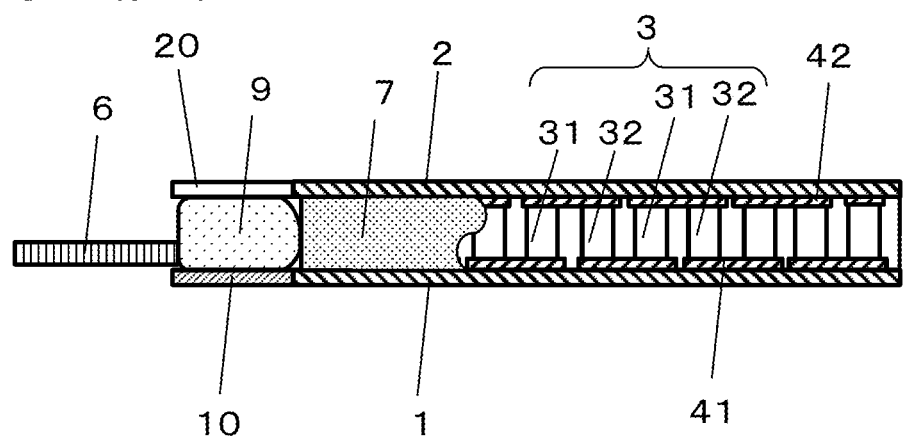
FIG. 5 is a side view showing the thermoelectric module shown in FIG. 4.
Figure 6:
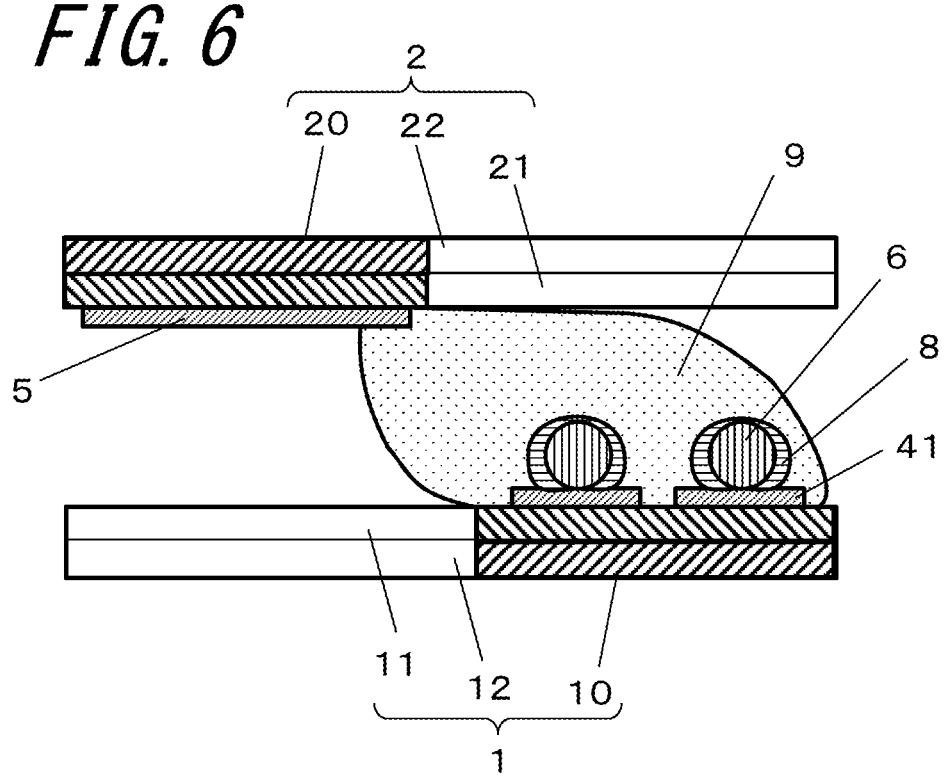
FIG. 6 is an enlarged cross-sectional view showing a principal part taken along the line VI-VI shown in FIG. 4.

Further, as shown in FIGS. 4 to 6, the protrusion 20 can protrude from an end of one side of the facing region of the second support substrate 2. In other words, the protrusion 20 can be located adjacent to the corner of the second support substrate 2.

As compared with the configuration as shown in FIGS. 1 to 3 in which the protrusion 20 is located apart from the corner of the second support substrate 2, the configuration as shown in FIGS. 4 to 6 in which the protrusion 20 is located adjacent to the corner of the second support substrate 2 is more likely to have warpage or deformation due to thermal stress. In such a configuration, the metal pattern 5, which is not electrically connected to the wiring conductor 42, is located on one main surface of the protrusion 20, so that the rigidity of the corner portion most prone to warpage or deformation due to the thermal stress is improved, thereby reducing the thermal stress.

Figure 7:
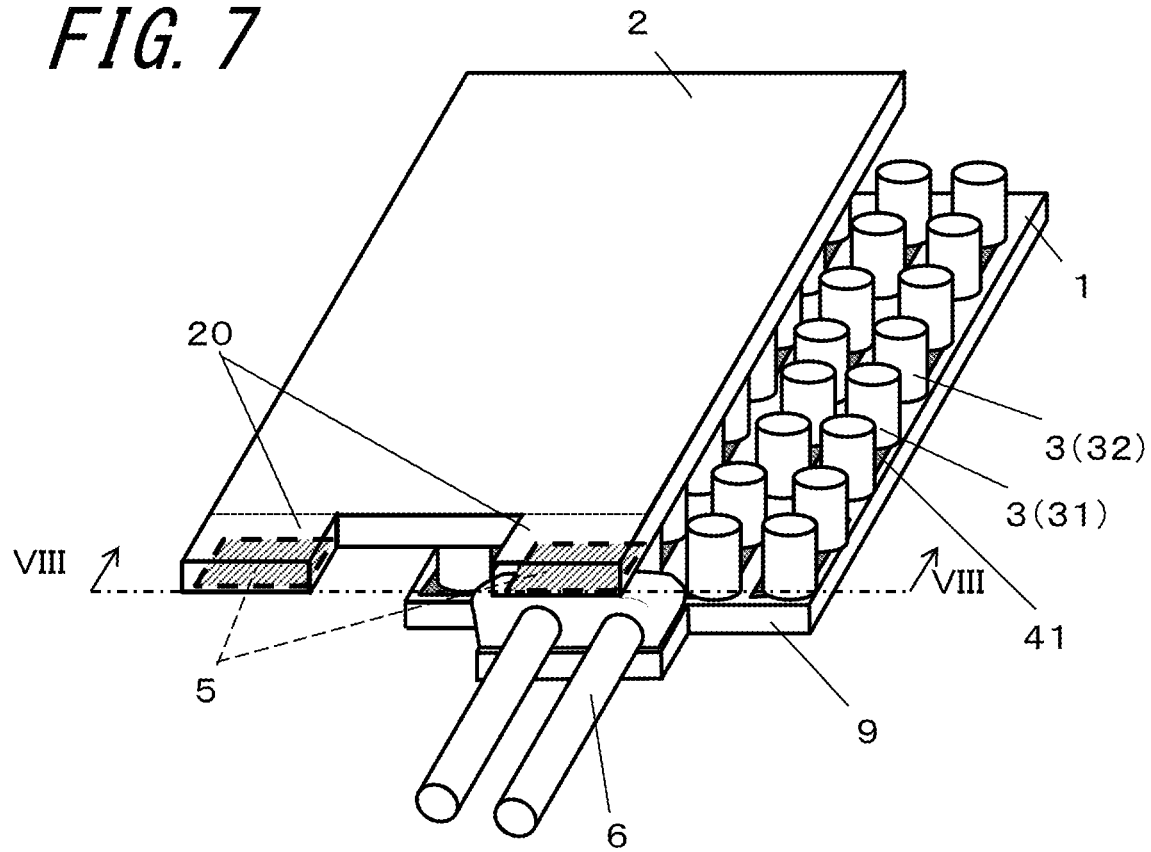
FIG. 7 is an exploded perspective view showing a thermoelectric module according to still another example of the embodiment.
Figure 8:
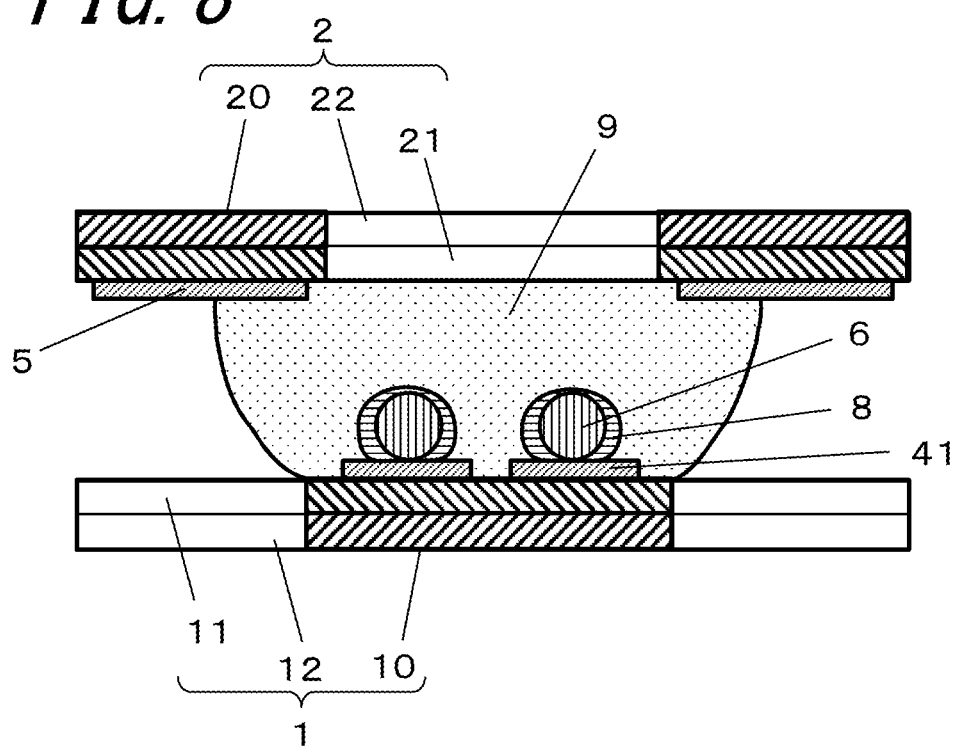
FIG. 8 is an enlarged cross-sectional view showing a principal part taken along the line VIII-VIII shown in FIG. 7.

Further, as shown in FIGS. 7 and 8, the protrusion 20 can protrude from each of both ends of one side of the facing region of the second support substrate 2. As a result, the covering material 9 may be joined to each protrusion 20, and the joining strength of the covering material 9 may be improved. In addition, there is no difference in the amount of heat radiated from both ends of the second metal plate 2 and partial irregularity of the temperature may be reduced.

Figure 9:
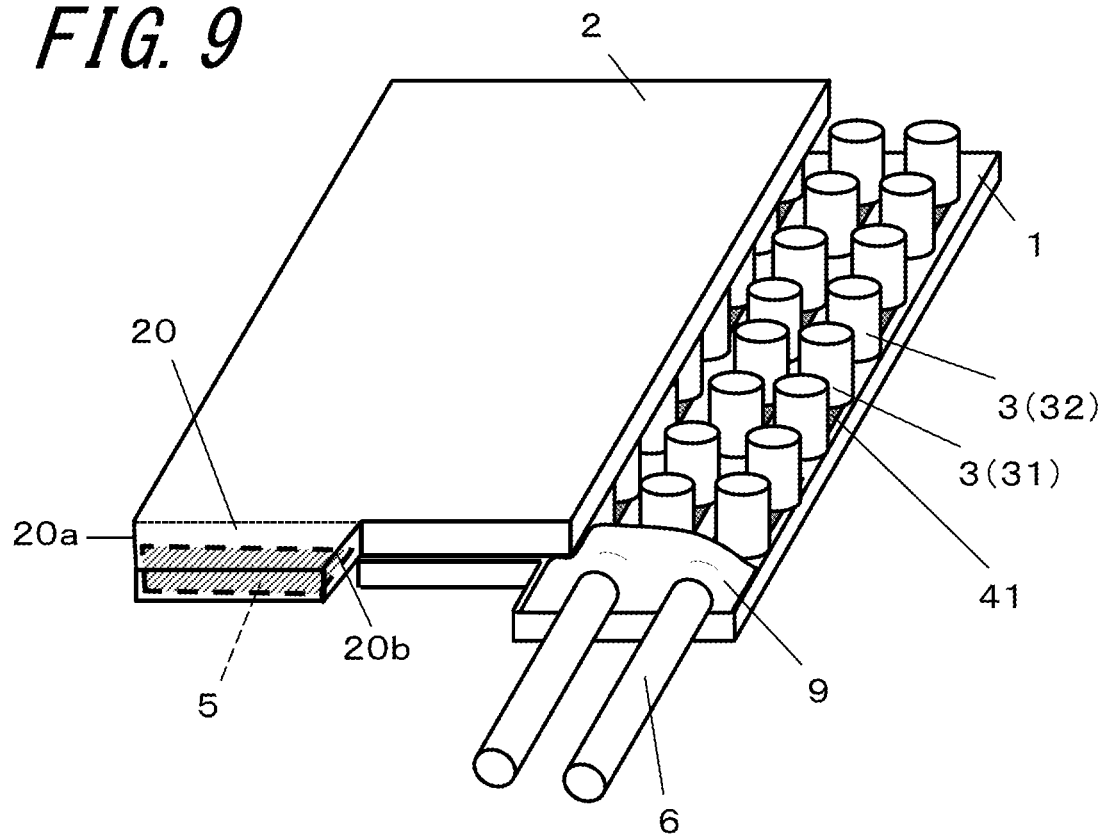
FIG. 9 is an exploded perspective view showing a thermoelectric module according to still another example of the embodiment.

In addition, as shown in FIG. 9, the protrusion 20 decreases in width as the protrusion extends outward from the facing regions in the plan view.

Here, the configuration shown in FIG. 9 is provided such that in the protrusion 20, a side (outer side 20a) on an edge in the direction along the one side of the facing region, and a side (inner side 20b) on a center portion side in the direction along the one side of facing region are inclined from a direction perpendicular to the one side of the facing region and the protrusion 20 decreases in width as the protrusion extends outward from the facing region. As a result, since an outside air easily flows in from the front end of protrusion 20, and flows through and out of the base portion, it is easy to radiate heat as compared with a heat source, thereby further improving heat dissipation property and durability.

Figure 10:
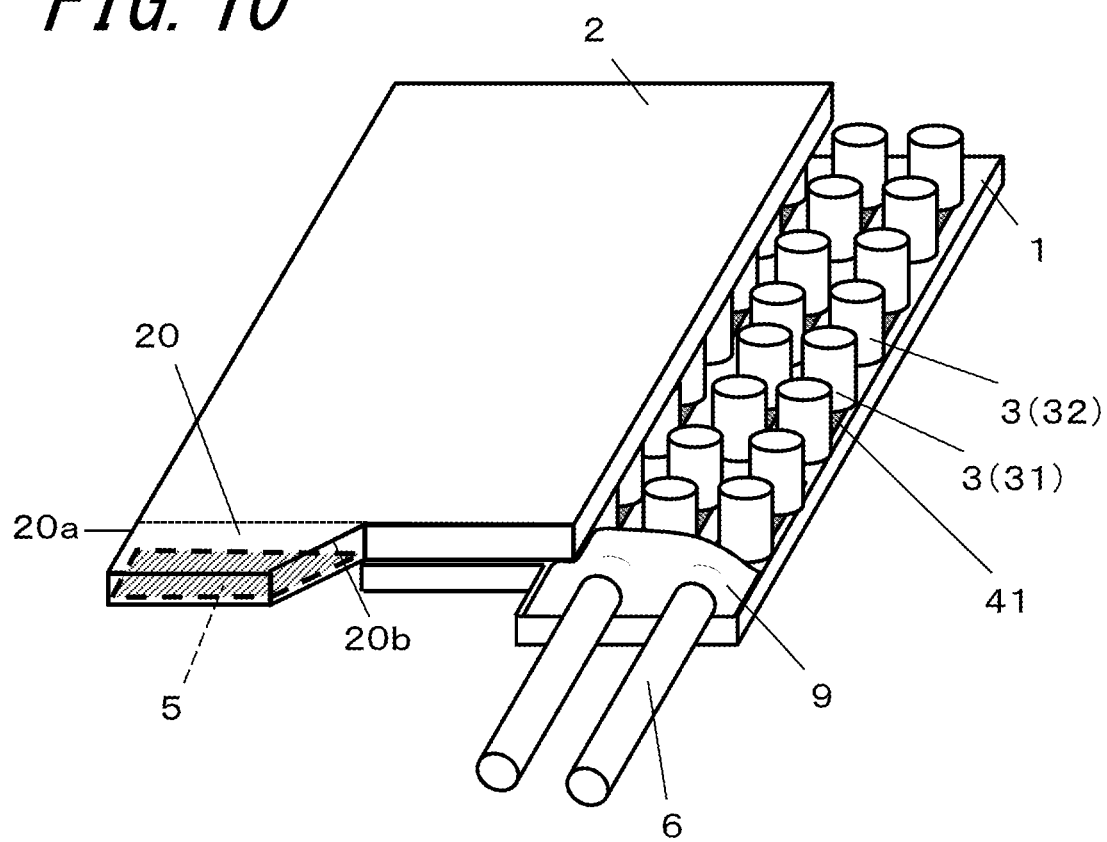
FIG. 10 is an exploded perspective view showing a thermoelectric module according to still another example of the embodiment.

On the other hand, as shown in FIG. 10, in a plan view the outer side 20a of the protrusion 20 extends in a direction perpendicular to the one side of the facing region, and the inner side 20b of the protrusion 20 is inclined from the direction perpendicular to the one side of the facing region and the protrusion 20 decreases in width as the protrusion extends outward from the facing region. Here, the one side of the facing region refers to the side where the protrusion 20 protrudes. In addition, the outer side 20a refers to one of the sides located on both sides of the protrusion 20 in the width direction (direction along the one side of the facing region), which is the side located on the end side in the direction along the one side of the facing region. Further, the inner side 20b refers to one of the sides located on both sides of the protrusion 20 in the width direction (direction along one side of facing regions), which is the side located on the center portion side in the direction along the one side of the facing region.

In the configuration shown in FIG. 10, the protrusion 20 is located adjacent to the corner of the second support substrate 2, and only the inner side 20b of the protrusion 20 is inclined, and the inclination angle of the inner side 20b is steeper than that shown in FIG. 9. According to this configuration, the rigidity of the protrusion 20 is generated on the side of the outer side 20a, and an outside air easily flows in from the front end of protrusion 20, and flows through and out of the base portion on the side of the inner side 20b, which particularly facilitates the radiation of the heat that tends to build up at the base portion inside the protrusion 20, and accordingly, it is possible to further improve heat dissipation property and durability.

Figure 11:
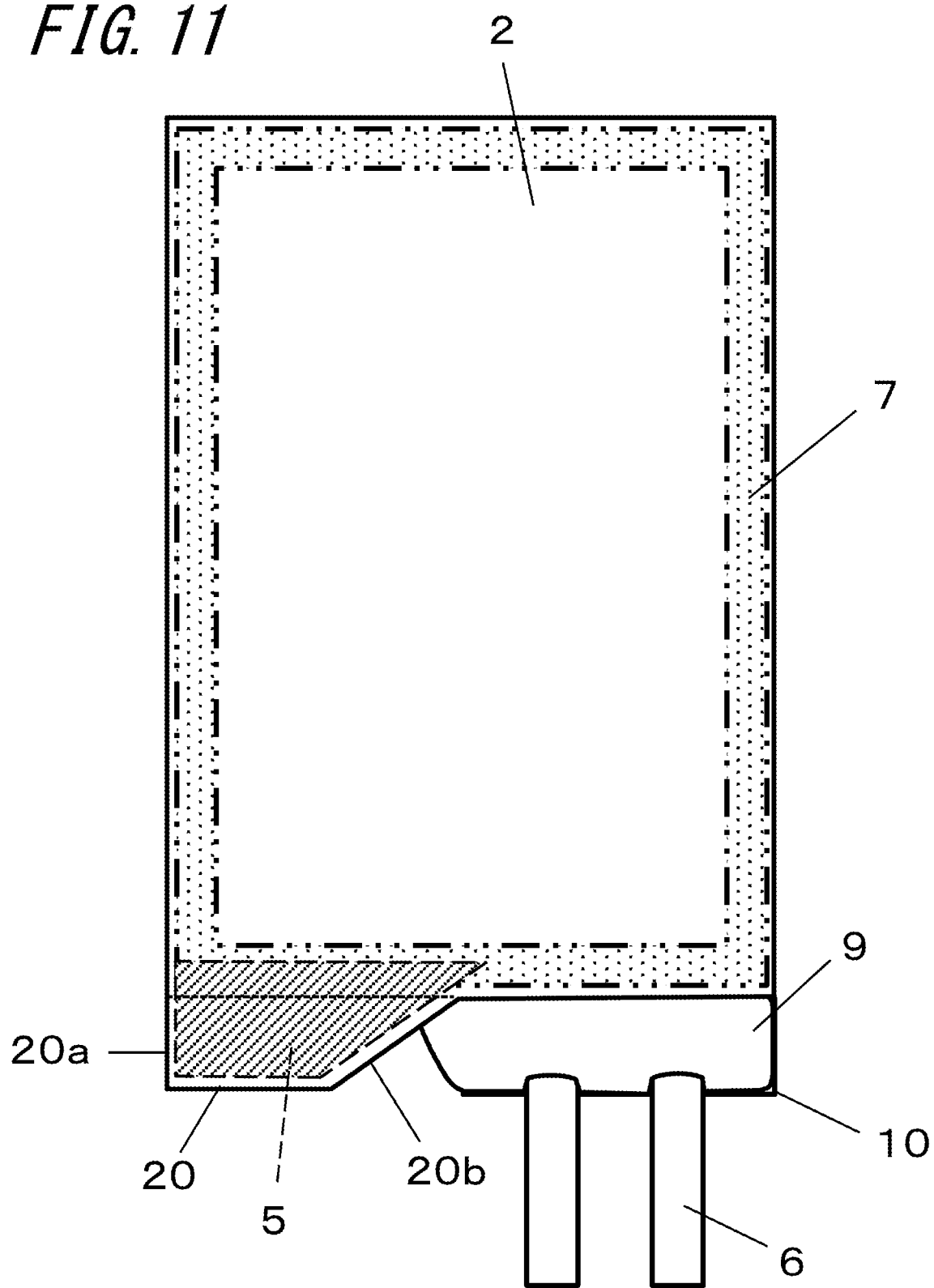
FIG. 11 is a partially transparent plan view showing a thermoelectric module according to still another example of the embodiment.

Further, as shown in FIG. 11, in the case where the sealing material 7 formed of resin is located along the outer periphery of the facing regions, the metal pattern 5 can extend to a position where a part thereof overlaps with the sealing material 7. The metal pattern 5 is located so as to overlap with the sealing material 7, but not to be connected to the second wiring conductor 42. As a result, the rigidity of the protrusion 20 may be further improved.

EXAMPLE

Hereinafter, the present embodiment will be described by way of example.

First, an N-type thermoelectric material and a p-type thermoelectric material including Bi, Sb, Te, and Se were melted and solidified by the Bridgman method to prepare a rod-shaped thermoelectric material having a circular cross section of 1.5 mm in diameter. Specifically, the p-type thermoelectric material was prepared with a solid solution of $Bi_2Te_3$ (bismuth telluride) and $Sb_2Te_3$ (antimony telluride), and the n-type thermoelectric material was prepared with a solid solution of $Bi_2Te_3$ (bismuth telluride) and $Bi_2Se_3$ (bismuth selenide). Here, in order to roughen the surface, the surfaces of the rod-shaped p-type thermoelectric material and n-type thermoelectric material were etched with nitric acid.

Next, the rod-shaped, p-type thermoelectric material and n-type thermoelectric material were cut with a wire saw to a height (thickness) of 1.6 mm to obtain a p-type thermoelectric element and an n-type thermoelectric element. In the resulting p-type thermoelectric element and n-type thermoelectric element, a nickel layer was formed on the cut surface by electrolytic plating.

Next, with respect to a both main-surface copper-clad substrate obtained by contacting a 105 μm thick copper plate (Cu) to both main surfaces of alumina filler-added epoxy resin under pressure, and a one main-surface copper-clad substrate/other main-surface aluminum-clad substrate obtained by contacting a 105 μm thick copper plate (Cu) to one main surface of the alumina filler-added epoxy resin under pressure and contacting a 105 μm thick aluminum plate (Al) to the other main surface of the alumina filler-added epoxy resin under pressure, the first support substrate and the second support substrate (facing region is 40 mm square) were prepared by etching the copper plate on the one main surface to define a desired wiring pattern (first wiring conductor, second wiring conductor). At this time, substrates of the shapes shown in FIGS. 1, 4 and 7 were prepared with respect to each of the first support substrate and the second support substrate.

Further, the p-type thermoelectric elements and the n-type thermoelectric elements were electrically connected in series by locating 127 pieces of the p-type thermoelectric elements and 127 pieces of the n-type thermoelectric elements on this solder paste by using a mounter. The p-type thermoelectric elements and the n-type thermoelectric elements located as described above are interposed between the first support substrate and the second support substrate, which was heated in a reflow furnace, with the upper and lower surfaces thereof subjected to pressure, so that the first wiring conductor and the second wiring conductor were joined to the thermoelectric element with solder.

Next, by using an air type dispenser, a sealing material formed of silicone was applied between the first support substrate and the second support substrate along the outer periphery thereof.

Two lead members for supplying current to the thermoelectric module were joined to the first wiring conductor with solder.

Next, a thermosetting epoxy resin was applied to the joint portion of the lead member by using an air dispenser, and was heated by a dry machine to cure the epoxy resin, to obtain a thermoelectric module.

In addition, Sample No. 1 was prepared to include protrusions of the shape shown in FIG. 1, in which the metal plate was formed of aluminum and the metal pattern was formed of copper. In addition, Sample No. 2 was prepared to include protrusions of the shape shown in FIG. 1, in which the metal plate was formed of copper and the metal pattern was formed of copper of the same material as a plate material of the metal plate. In addition, Sample No. 3 was prepared to include protrusions of the shape shown in FIG. 4, in which the metal plate was formed of copper and the metal pattern was formed of copper of the same material as a plate material of the metal plate. In addition, Sample No. 4 was prepared to include protrusions of the shape shown in FIG. 7, in which the metal plate was formed of copper and the metal pattern was formed of copper of the same material as a plate material of the metal plate. In addition, Sample No. 5 (comparative example) was prepared to include protrusions of the shape shown in FIG. 1, in which the metal plate was formed of aluminum and had no metal pattern.

A thermally conductive grease was applied to the surfaces of the first support substrate and the second support substrate of the resulting thermoelectric module, and after being set on a heat sink adjusted to a temperature of 75° C., electric power of 60 W was applied to the thermoelectric module to generate a temperature difference, and current-carrying directions were reversed at intervals of 30 seconds to execute 10,000 cycles of endurance test, the surface temperature of the second support substrate was sampled every second with a K-type thermocouple, and the maximum temperature during the test period was calculated. In addition, the resistance value as obtained before and after the endurance test was measured with a four-terminal AC resistance meter to calculate a rate of resistance changes. The results are shown in Table 1.

TABLE 1

| Sample No. | Shape | Second support substrate (materials of insulating substrate + metal plate) | Material of metal pattern | Maximum temperature of second support substrate | Rate of resistance changes |
|---|---|---|---|---|---|
| 1 | FIG. 1 | epoxy resin + Al | Cu | 96° C. | 5.8% |
| 2 | FIG. 1 | epoxy resin + Cu | Cu | 92° C. | 4.2% |
| 3 | FIG. 4 | epoxy resin + Cu | Cu | 86° C. | 2.4% |
| 4 | FIG. 7 | epoxy resin + Cu | Cu | 81° C. | 1.2% |
| 5 | FIG. 1 | epoxy resin + Al | — | 104° C. | 38.5% |

According to Table 1, it was found that Sample No. 1 in which the metal pattern is located on the protrusion has a lower maximum temperature of the second support substrate, and also has a smaller rate of resistance changes of the thermoelectric module before and after the endurance test, as compared with Sample No. 5 in which the metal pattern is not located on the protrusion. That is, it turns out that the thermoelectric module of Sample No. 1 is more excellent in heat dissipation property and durability.

In addition, it can be seen that Sample No. 2 having the same material of the metal pattern as the metal plate constituting the second support substrate has a lower maximum temperature of the second support substrate, and also has a smaller rate of resistance changes of the thermoelectric module before and after the endurance test and provides better results, even when compared with Sample No. 1.

In addition, it can be seen that Sample No. 3 in which the protrusion having the metal pattern is disposed at the end of the second support substrate has a lower maximum temperature of the second support substrate, and also has a smaller rate of resistance changes of the thermoelectric module before and after the endurance test and provides better results, even when compared with Sample No. 2.

In addition, it can be seen that Sample No. 4 in which the protrusion having the metal pattern is disposed at both ends of the second support substrate has a lower maximum temperature of the second support substrate, and also has a smaller rate of resistance changes of the thermoelectric module before and after the endurance test and provides better results, even when compared with Sample No. 3.

REFERENCE SINGS LIST

1: First support substrate
11: First insulating substrate
12: First metal plate
2: Second support substrate
21: Second insulating substrate
22: Second metal plate
20: Protrusion
20a: Outer side
20b: Inner side
3: Thermoelectric element
31: p-type thermoelectric element
32: n-type thermoelectric element
41: First wiring conductor
42: Second wiring conductor
5: Metal pattern
6: Lead member
7: Sealing material
8: Joining material
9: Covering material

The invention claimed is:

1. A thermoelectric module, comprising:
a pair of insulating substrates, each insulating substrate comprising a first surface in a plan view and second surface opposite to the first surface, wherein the first surface of each of the pair of insulating substrates faces each other;
wiring conductors located on the first surface of each of the pair of insulating substrates;
a pair of metal plates located on the second surfaces of each of the pair of insulating substrates; and
a plurality of thermoelectric elements located between the first surface of each of the pair of insulating substrates,
a first protrusion protruding from one insulating substrate of the pair of insulating substrates and one metal plate of the pair of metal plates, and a metal pattern located on a first main surface of the protrusion, the metal pattern electrically isolated from any one of the wiring conductors on either one of the first surface or the second surface of which the first protrusion protrudes, and
wherein, in the plan view of the thermoelectric module, the first protrusion decreases in width as the first protrusion extends in a direction away from the plurality of thermoelectric elements.

2. The thermoelectric module according to claim 1, wherein the metal pattern and the pair metal plates are formed of a same material.

3. The thermoelectric module according to claim 1, wherein the first protrusion protrudes from a first side surface of one insulating substrate of the pair of insulating substrates.

4. The thermoelectric module according to claim 3, wherein the first protrusion protrudes from a second side of the one insulating substrate of the pair of insulating substrates.

5. The thermoelectric module according to claim 1, wherein, in the plan view of the thermoelectric module, the first protrusion includes an outer side and an inner side which are inclined from a direction perpendicular to the first surface or the second surface of one insulating substrate of the pair of insulating substrates.

6. The thermoelectric module according to claim 1, wherein, in a plan view of the thermoelectric module, the first protrusion includes an outer side extending parallel to a side surface of one of the pair of insulating substrate and an inner side inclined in the direction perpendicular to the first surface or the second surface of the insulating substrate.

7. The thermoelectric module according to claim 1, further comprising a sealing material formed of resin, the sealing material located along an outer periphery of the pair of insulating substrates,
wherein the metal pattern extends to a position where a part of the metal pattern overlaps with the sealing material.

8. A thermoelectric module, comprising:
a first support substrate comprising a first insulating substrate attached to a first metal plate;
a second support substrate comprising a second insulating substrate attached to a second metal plate, the first insulating substrate and the second insulating substrate each having a first surface wherein the first surface of the first insulating substrate faces the first surface of the second insulating substrate in a plan view;
first wiring conductors located on the first surface of the first insulating substrate, and second wiring conductors located on the first surface of the second insulating substrate;
a plurality of thermoelectric elements located between the first surfaces of the first insulating substrate and the first surface of the second insulating substrate, and electrically connected through the first wiring conductors and the second wiring conductors;
wherein the first support substrate or the second support substrate comprises a first protrusion in the plan view, the first protrusion comprising a metal pattern that is electrically isolated from any one of the wiring conductors on either one of the first support substrate or the second support substrate of which the first protrusion protrudes, and
wherein the protrusion comprises an angled outer side and an angled inner side that decrease a width of the first protrusion as the first protrusion extends in a direction away from the plurality of thermoelectric elements .

9. The thermoelectric module according to claim 8, wherein the metal pattern and at least one of the first metal plate and the second metal plate are formed of the same material.

10. The thermoelectric module according to claim 8, wherein the first protrusion protrudes from a first side of either the first support substrate or the second support substrate, and the first protrusion has a width equal to or less than half of a width of the first side.

11. The thermoelectric module according to claim 10, further comprising a second protrusion.

12. The thermoelectric module according to claim 10, wherein the first protrusion comprises an angled outer side and a perpendicular inner side that decrease a width of the first protrusion as the first protrusion extends in a direction away from the plurality of thermoelectric elements.

13. The thermoelectric module according to claim 10, wherein the first protrusion comprises a perpendicular outer side and an angled inner side that decrease a width of the first protrusion as the first protrusion extends in a direction away from the plurality of thermoelectric elements.

14. The thermoelectric module according to claim 8, further comprising a sealing material formed of resin, the sealing material located along an outer periphery of the first surfaces of the first insulating substrate and the first surface of the second insulating substrate,
wherein the metal pattern of the at least one protrusion extends to a position where a part of the metal pattern overlaps with the sealing material.

* * * * *